United States Patent
Bau (10) Patent No.: US 8,552,814 B2
(45) Date of Patent: Oct. 8, 2013

(54) OUTPUT IMPEDANCE COMPENSATION FOR VOLTAGE REGULATORS

(76) Inventor: W. John Bau, Santa Fe, NM (US)

( * ) Notice: Subject to any disclaimer, the term of this patent is extended or adjusted under 35 U.S.C. 154(b) by 459 days.

(21) Appl. No.: 13/022,455

(22) Filed: Feb. 7, 2011

(65) Prior Publication Data

US 2012/0001702 A1    Jan. 5, 2012

Related U.S. Application Data (60) Provisional application No. 61/398,833, filed on Jul. 1, 2010.

(51) Int. Cl.
*H03H 7/38* (2006.01)

(52) U.S. Cl.
USPC .......................................................... 333/32

(58) Field of Classification Search
USPC .............................................. 333/32, 33, 17.3
See application file for complete search history.

(56) References Cited

U.S. PATENT DOCUMENTS

| | | | |
|---|---|---|---|
| 4,771,227 A | 9/1988 | Nelson | |
| 5,463,359 A | 10/1995 | Heaton | |
| 7,675,272 B2 | 3/2010 | Michallick et al. | |
| 2008/0061901 A1* | 3/2008 | Gilmore | 333/17.3 |
| 2013/0127561 A1* | 5/2013 | du Toit et al. | 333/17.3 |

OTHER PUBLICATIONS

Understanding Power Impedance Supply for Optimum Decoupling, application note 3, downloaded article from internet on Apr. 17, 2010, Apr. 2001 publication date, 6 pages, Calex, Concord, Ca.

Jan Didden, Regulators for High-Performance Audio, article, Mar. 1995, 30 pages, The Audio Amateur.

* cited by examiner

*Primary Examiner* — Stephen Jones
(74) *Attorney, Agent, or Firm* — Matthew F. Lambrinos; Franklin & Associates International

(57) ABSTRACT

Method and circuit topology for an impedance compensation circuit (ICC), for compensating a DC voltage regulator circuit (RC). The ICC comprises individual components that are workable in combination with an inherent output impedance characteristic of the RC. The components are optimizable for providing a substantially uniform AC output impedance characteristic and impedance phase over a first defined frequency range and an operating idle current under a load, by creating a condition where a source impedance and a load impedance are complex conjugates. The source impedance is a series combination of the inherent output impedance characteristic of the RC and a first impedance due to a first portion of the individual components. The load impedance is a parallel combination of a second impedance due to a second portion of the individual components and the load, when the ICC is configured with the RC and the load.

20 Claims, 5 Drawing Sheets

Fig. 9

OUTPUT IMPEDANCE COMPENSATION FOR VOLTAGE REGULATORS

CROSS REFERENCE TO PROVISIONAL APPLICATION

This Application claims priority under 35 U.S.C. §119(e) to the U.S. Provisional Patent Application No. 61/398,833, entitled "Output Impedance Compensation for Voltage Regulators", which was filed Jul. 1, 2010, the disclosure of which is incorporated herein by reference.

TECHNICAL FIELD

The present invention is in the technical field of electronic circuits, and more particularly to linear DC voltage regulator circuits.

BACKGROUND

A Linear Voltage Regulator (hereinafter "regulator") is a DC voltage regulator circuit based on an active element which is operating in its linear region. It accepts a DC voltage at its input and provides a regulated DC voltage at its output. It is a basic building block of a power supply which provides power to electronic devices (the "load"). The most common designs use feedback circuits to compare the output to a reference voltage and apply correction, albeit with a time lag, to keep the output voltage constant. Many such regulators have been developed; they are widely available in integrated circuit ("IC") form, and can be built using discrete components.

Figure 1:
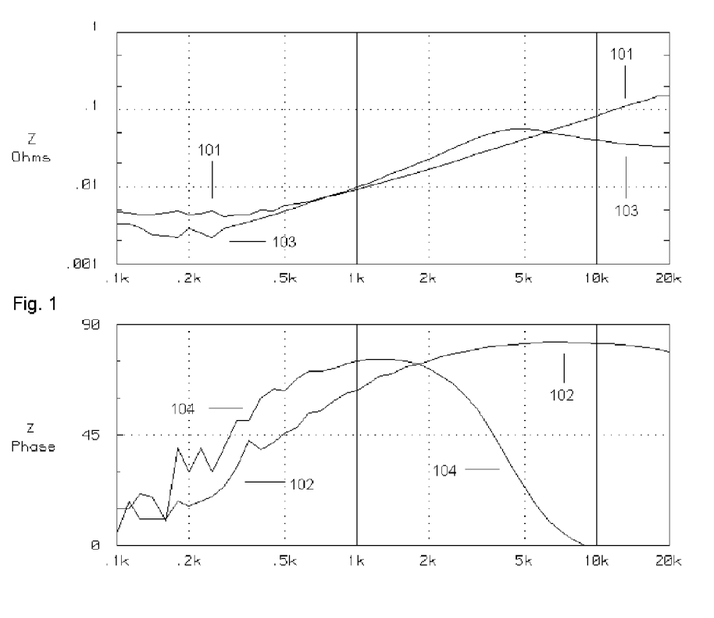
FIG. 1 shows graphs of output impedance vs frequency and impedance phase vs frequency for a common regulator, with minimum output capacitance, and with 1000 uF output capacitance.

In many applications, for instance when it is used to power devices that process AC signals, in addition to providing a regulated DC voltage, the regulator also functions as a source of AC current on demand. Ideally, the output impedance of the AC current source would be resistive over the frequency range of use. This can be examined by plotting the regulator's output impedance and impedance phase vs. frequency. The typical pattern found is that of an output impedance with some small finite resistance and then rising with increasing frequency (FIG. 1-101), a basically inductive characteristic as verified by the impedance phase (FIG. 1-102). It can be modeled (FIG. 3-301) as a resistance (Rout) in series with an inductance (Lout). This output impedance profile is not ideal for an AC current source and should be compensated for.

Figure 2:
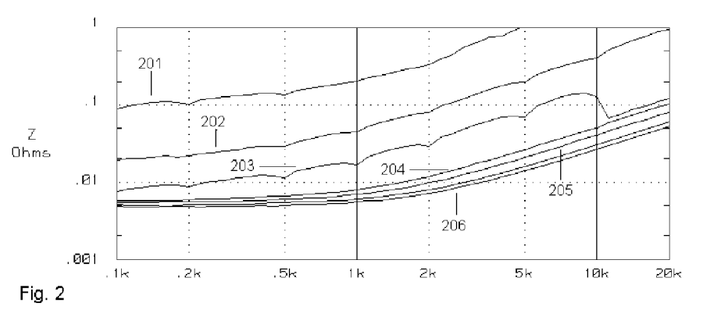
FIG. 2 shows graphs of output impedance vs. frequency at various load currents for a common regulator.

Additionally, under some conditions, the distribution of the regulator's output impedance vs. frequency is not constant, but is significantly affected by the amount of quiescent (or "idle") current being drawn by the load. Refer to FIG. 2, in which plots of output impedance vs. frequency at various idle currents for a common regulator are graphed. 201 graphs 10 mA, 202 graphs 15 mA, 203 graphs 30 mA, 204 graphs 40 mA, 205 graphs 50 mA, and 206 graphs 100 mA idle currents. Starting from a no-load condition, as the idle current is increased, the regulator output impedance trends rapidly lower, to a point where further current increases result in little impedance change, marking the low point of a "stable region." For the regulator shown, this point is around 40-50 mA. A similar phenomena occurs as the load current begins to approach the regulator's output current design limits, marking the high point of the stable region. From these graphs, it can be seen that operating a regulator at idle currents outside of its stable region will result in significant impedance modulation as the load draws AC current, adding error to the system.

Industry standard practice is to place capacitance from the regulator output to the zero volts reference (aka "common" or "ground"), partly to counteract the inductive regulator output impedance, but primarily to filter the regulator's output noise. Some regulators require a minimum, or specified range of, output capacitance value for stable operation. And some regulators require specific values of Equivalent Series Resistance ("ESR") of the output capacitor for stable operation. While simply adding capacitance to the output does lower the output noise and overall average output impedance, this approach has a significant drawback. It forms a resonant circuit with the regulator Lout, creating a nonuniform impedance (FIG. 1-103) and impedance phase (FIG. 1-104) characteristic.

Two prior techniques have been used to counter this resonance. A common technique is to place a resistor (typically 1 Ohm and greater) in series with the regulator output, between the regulator output and the output capacitor. The large resistance swamps the Lout and forms an RC filter with the output capacitor. While this is effective for improving the output noise filtering, it has several drawbacks from an impedance perspective. AC current drawn through the large resistor induces proportionally more AC ripple on the DC voltage. The resistor limits the maximum current which can be delivered to the load. And the output impedance and impedance phase, which was inductive, is now capacitive, and still very nonuniform.

Another technique (Calex) adds sufficient resistance (typically 100 mOhms or greater) in series with the output capacitor, between output capacitor and ground, to damp the resonance. This smoothes the impedance at and above resonance. But it has no effect on the frequency region below the resonance, leaving intact the inductive characteristic, and a nonuniform phase characteristic as well.

While not technically an output impedance compensation circuit, it is worth noting that some high-performance discrete regulators have been designed (Jung et al) that significantly lower the overall output impedance and voltage noise. But they still have an inductive output impedance characteristic with the attendant phase shift.

In none of the above cases was there an intent to make the regulator output impedance and impedance phase uniform, or to coordinate the impedance compensation circuit with the idle current effects. Therefore, it would be desirable to provide a method to accomplish this, in a form that can be applied to any regulator with an inductive output impedance characteristic.

SUMMARY

According to a first aspect of the present invention, an impedance compensation circuit (ICC) is proposed, for being configured at an output terminal (OT) of a DC voltage regulator circuit (RC). The ICC comprises individual components that are workable in combination with an inherent output impedance characteristic of the RC. The individual components are optimizable for providing a substantially uniform AC output impedance characteristic and impedance phase over a first defined frequency range (DFR) and an operating idle current under a load, by creating a condition where a source impedance and a load impedance are complex conjugates. The source impedance is a series combination of the inherent output impedance characteristic of the RC and a first impedance due to a first portion of the individual components, while the load impedance is a parallel combination of a second impedance due to a second portion of the individual components and the load, when the ICC is configured with the RC and the load.

According to an embodiment of the first aspect, the individual components are further optimizable for maintaining a desirably low value of the substantially uniform AC output impedance characteristic over a second DFR and a specified idle current, the specified idle current being higher than the operating idle current and obtainable by adding a static load in parallel with the load.

According to a second aspect of the present invention, an impedance compensation circuit (ICC) is provided, for being configured at an output terminal (OT) of a DC voltage regulator circuit (RC). The ICC comprises individual components, that further comprise:

a serial combination of an inductance (L1) and a resistance (R1), to form a first element, a resistance (R2) connected in parallel with the first element to form a two terminal second element, the second element being connectable to the OT by a first terminal, and a serial combination of a capacitance (C3) and a resistance (R3), to form a third element that is connected between a second terminal of the second element and a common terminal, wherein an output (Vout) from the ICC can be provided between the second terminal and the common terminal for sourcing a load R4.

The L1 includes any inductance in connecting traces or wires between the OT and the C3, the L1 and an output inductance (Lout) of the RC combinedly forming an inductive element of a source impedance. The source impedance is a series combination of the inherent output impedance of the RC and a first impedance due to a first portion of the individual components. The R1 includes a resistance of L1 and any resistance in connecting traces or wires between the OT and the C3. The R1 and an output resistance (Rout) of the RC combinedly form a resistive element of the source impedance. The R2 operatively sets an upper limit to an impedance rise of the L1 at high frequencies normally above a first defined frequency range (DFR) and the C3 forms a capacitive element of a load impedance. The load impedance is a parallel combination of a second impedance due to a second portion of the individual components and the load R4, when the ICC is configured with the RC and the load R4. The R3 is a serial combination of: a) an equivalent resistance of the C3, b) any resistance in connecting traces or wires between the C3 and the common terminal, and c) any added resistance necessary to achieve a desired value of the R3. The R3 is substantially equal to the (R1+Rout) and defines a resistive element of the load impedance. The individual components are workable in combination with the inherent output impedance characteristic of the RC. The individual components are optimized for providing a substantially uniform AC output impedance characteristic and impedance phase over the first DFR and an operating idle current under the load R4, by creating a condition where the source impedance and the load impedance are complex conjugates.

According to an embodiment of the second aspect, the individual components are further optimizable for maintaining a desirably low value of the substantially uniform AC output impedance characteristic over a second DFR and a specified idle current. The specified idle current is higher than the operating idle current and obtainable by adding a static load R5 in parallel with the load R4.

According to a third aspect of the present invention, a method of compensating a DC voltage regulator circuit (RC) is provided. The method is to use an impedance compensation circuit (ICC) configured at an output terminal (OT) of the RC. The ICC comprises individual components that are workable in combination with an inherent output impedance characteristic of the RC. The individual components are optimizable for providing a substantially uniform AC output impedance characteristic and impedance phase over a first defined frequency range (DFR) and an operating idle current under a load, by creating a condition where a source impedance and a load impedance are complex conjugates. The source impedance is a series combination of the inherent output impedance characteristic of the RC and a first impedance due to a first portion of the individual components, while the load impedance is a parallel combination of a second impedance due to a second portion of the individual components and the load, when the ICC is configured with the RC and the load. The method is to establish the first DFR, measure the operating idle current, measure the inherent output impedance characteristic of the RC, calculate an inductance of the RC within the first DFR and optimize the individual components for providing the substantially uniform AC output impedance characteristic and impedance phase over the first DFR at the operating idle current, by creating the condition where the source impedance and the load impedance are complex conjugates.

According to an embodiment of the third aspect, the method is further to optimize for maintaining a desirably low value of the substantially uniform AC output impedance characteristic over a second DFR and a specified idle current, the specified idle current being higher than the operating idle current and obtainable by adding a static load in parallel with the load.

In the above aspects and embodiments of the invention, the first DFR may be same as the second DFR.

BRIEF DESCRIPTION OF THE DRAWINGS

In order that the present invention may be more readily understood, reference will now be made to the accompanying drawings, in which.

DETAILED DESCRIPTION

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details.

The Compensation Circuit Topology

Figure 3:
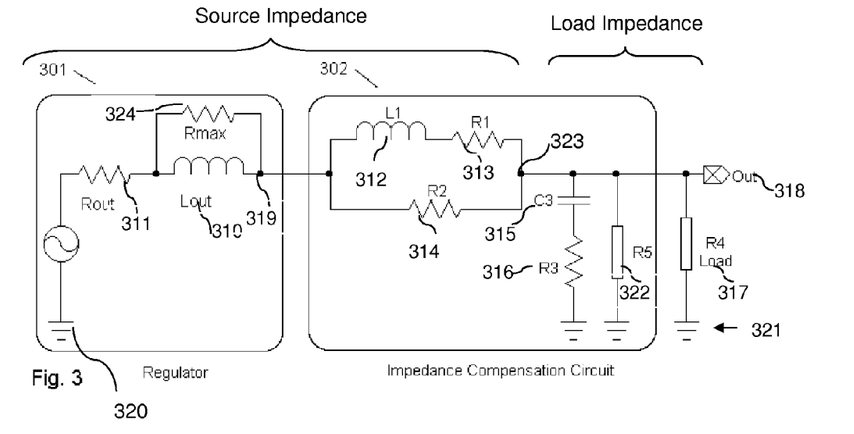
FIG. 3 is a schematic diagram of a regulator output impedance model with the impedance compensation circuit topology on its output according to an embodiment.
Figure 3A:
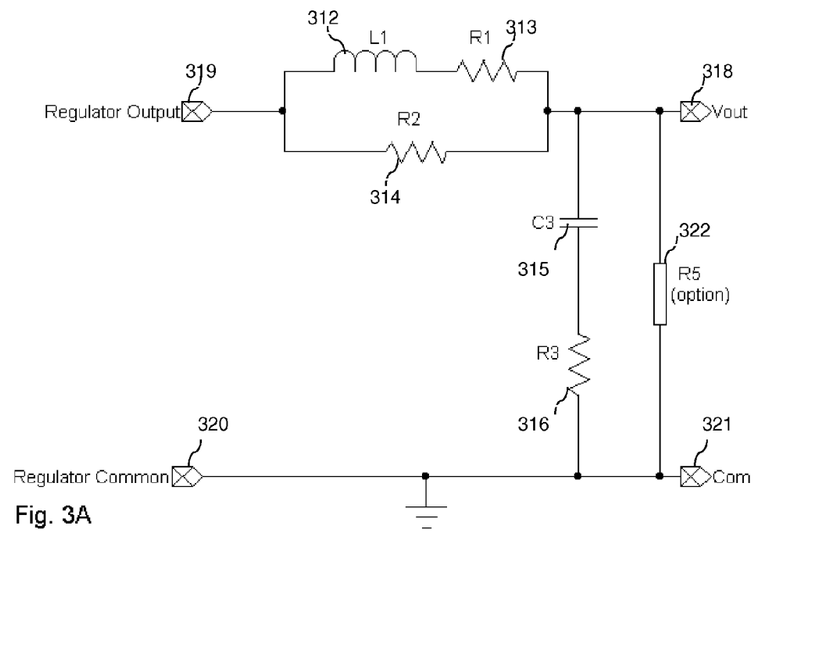
FIG. 3A is a schematic diagram of the impedance compensation circuit topology, for the circuit topology in FIG. 3.

Referring to the schematic diagram of the compensation circuit topology in FIGS. 3 and 3A, a detailed description of the individual components follows.

L1 312 is a small-value inductance, measured at 10 kHz. Included in this value is any inductance in the connecting traces or wires between the regulator output 319 and the capacitance C3 315. L1 312, plus the regulator's output inductance (Lout) 310 at the specified load idle current, combine to form the inductive element of the source impedance.

R1 313 is a small-value resistance, measured at DC. In many cases, the AC impedance at a low frequency (100 Hz or below) can be used in place of the DC measurement. Included in this value is the DC resistance of L1 312, plus any resistance in the connecting traces or wires between the regulator output 319 and the capacitance C3 315. R1 313, plus the regulator's inherent output resistance (Rout) 311 at the specified load idle current, combine to form the resistive element of the source impedance, and coordinates with R3 316 to establish the basic output impedance that the circuit 302 is optimized for.

R2 314 is a low-value resistance, measured at DC. It sets an upper limit to L1's 312 impedance rise at high frequencies. While typical values will be in the 0.5 Ohm to 10 Ohm range, the value chosen will be determined to some extent by interaction with the reactances of the load circuit well above the DFR. If R2 314 is less than 100*R1 313 then its parallel value must also be included in R1 313. The value of Rmax 324 can be used as a starting value for R2 314, Rmax 324 being the maximum value of the regulator's inherent output impedance.

C3 315 is a capacitance, measured at 10 kHz, consisting of one or more physical capacitors in parallel. C3 315 forms the capacitive element of the load impedance.

R3 316 is a low-value resistance, consisting of the Equivalent Series Resistance (ESR) of C3 315 (measured at 10 kHz and at the normal operating temperature at which the circuit will be used), plus any resistance in the connecting traces or wires from C3 315 to the regulator's common 320 (if any), plus any added resistance necessary to achieve the desired value. R3 316 defines the resistive element of the load impedance, and its value will be approximately equal to (R1 313+ Rout 311).

R4 317 is the resistance-equivalent of the specified load idle current that the circuit 302 is being optimized for. Ideally, but not necessarily, this load current will be in or near the "stable region" of output impedance described in the Background section. If the actual idle current drawn by the load R4 317 is less than the specified idle current value, an appropriate resistance 322 is connected from the regulator output 319 to common 320 to raise the idle current to the desired value. This resistance 322 can be located either before or after the compensation circuit 302, if not already included in the compensation circuit 302. In other implementations, if the actual idle current drawn by the load is less than the specified idle current value, it can be raised to the desired value by adding a static load R5 322 of the appropriate amount from the regulator output 319 to common 320. This static load R5 322 can be located either before or after the compensation circuit 302, if not already included in the compensation circuit 302. A series combination of a light-emitting diode (LED) and a current-limiting resistor is one example of such a static load R5 322. The LED can give a visual indication that the circuit is in operation.

The source impedance is a serial combination of the inherent output impedance of the RC 301 and the impedance of the second element comprising of L1 312, R1 313, and R2 314. The load impedance is a parallel combination of the third element C3 315+R3 316 in parallel with the load R4 317. The source impedance and the load impedance intersect at the second terminal 323, wherein the conjugate balance occurs. The output of the compensation circuit is drawn at the terminal Vout 318, which is electrically equivalent to terminal 323. In the examples given below, C3+R3 are so dominant that R4 is ignored.

EXAMPLES

The following examples show the invention applied to some common series voltage regulators 301. Input voltages and other components shown in the diagrams are as per the manufacturers guidelines, unless specified otherwise. As will be shown, regulators 301 that provide access to adjust their DC output (or other parameters) may benefit from additional components to optimize their impedance and/or impedance phase uniformity, but the compensation circuit topology 302 at the output 319 remains the same.

The examples below assume a DFR of uniform output impedance and impedance phase up to 20 kHz, suitable for audio and other low-frequency AC signal processing. The measurement frequencies of the compensation circuit components have been chosen with this, and with the capabilities of commercially-available component test instruments, in mind.

The output impedance and phase measurements were made with a variable-frequency impedance meter, at the points where C3 315 connects with the voltage output trace 323 and where R3 316 connects to the common trace 321. These are the impedance reference points from which the regulator 301 delivers power to the load.

Example 1

Impedance Compensation for a 3-Terminal Fixed Output Regulator 301

Figure 4:
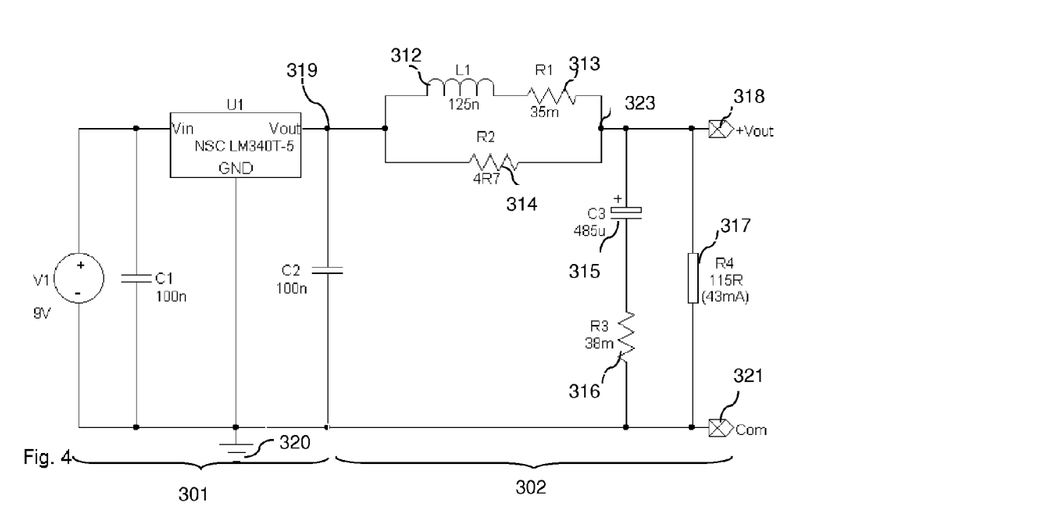
FIG. 4 is a schematic diagram of the compensation circuit topology applied to a fixed-output regulator, the National Semiconductor LM340T-5.0, optimized for a nominal 40 mOhm output impedance, according to an embodiment.
Figure 5:
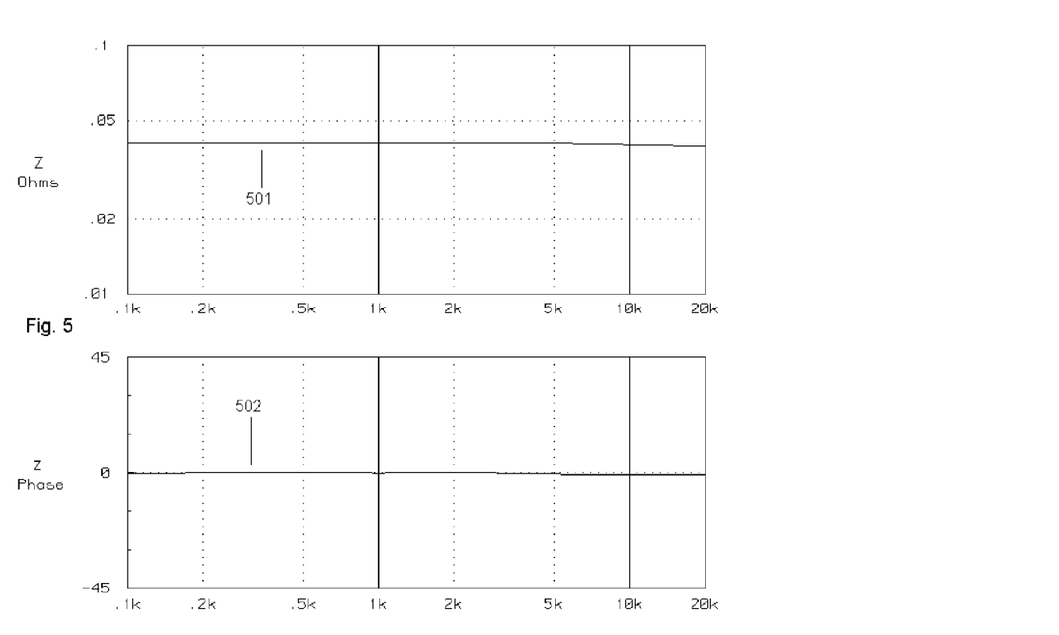
FIG. 5 are graphs of output impedance vs frequency and impedance phase vs frequency, for the circuit in FIG. 4.

The simplest and most common of the series regulators 301 is a 3-terminal fixed output voltage regulator 301. The National Semiconductor LM340T-5.0 is a fixed +5 VDC regulator 301. With a load idle current of 43 mA, it has Rout 311=4.2 mOhm and Lout 310 at 10 kHz=685 nH. Using the compensation circuit 302 shown in FIG. 4 results in a nominal 40 mOhm output impedance (FIG. 5-501) with little or no impedance phase shift (FIG. 5-502), for the DFR up to 20 kHz.

Example 2

Impedance Compensation for a 3-Terminal Adjustable Output Regulator 301

Figure 6:
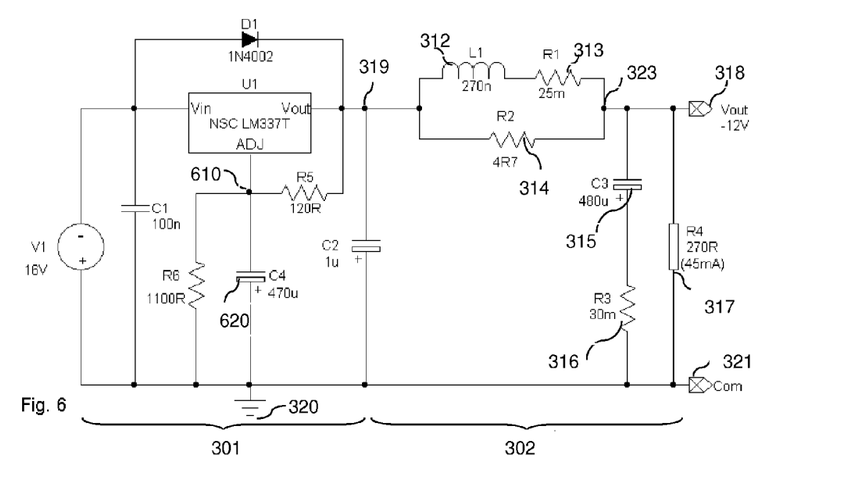
FIG. 6 is a schematic diagram of the compensation circuit topology applied to an adjustable-output regulator, the National Semiconductor LM337T, optimized for a nominal 30 mOhm output impedance, according to an embodiment.
Figure 7:
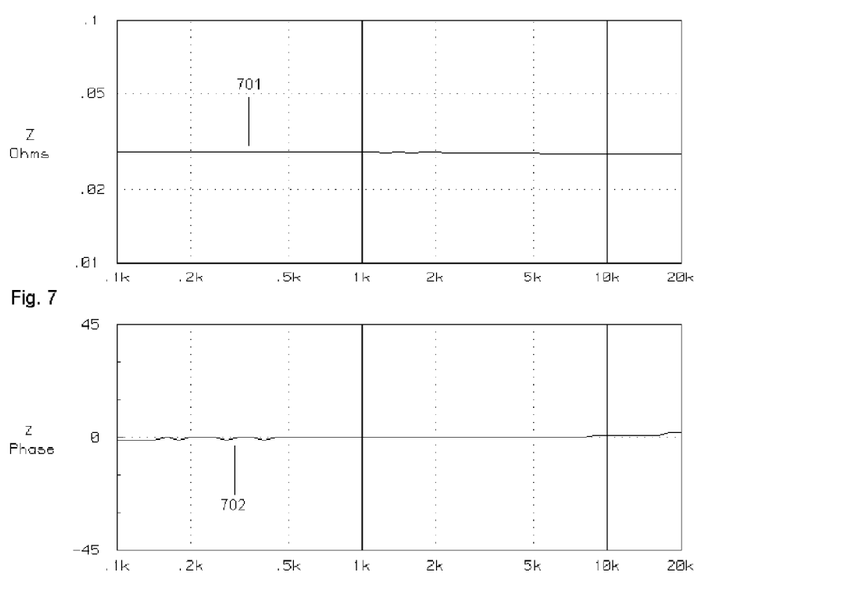
FIG. 7 are graphs of output impedance vs frequency and impedance phase vs frequency, for the circuit in FIG. 6.

The output impedance of a 3-terminal adjustable output regulator 301 is affected by capacitance C4 620 placed from the adjust terminal 610 to common 320 (FIG. 6). Manufacturers recommend using values from 1 uF to 25 uF, citing lower noise and improved ripple rejection, but higher values will improve the impedance and phase uniformity at low frequencies. 470 uF is used in this example, but there is no penalty to using even higher values. The National Semiconductor LM337T is an adjustable regulator 301 for negative DC output voltages. It is shown here set for a −12 VDC nominal output. With a load idle current of 45 mA, it has Rout 311=4.8 mOhm and Lout 310 at 10 kHz=125 nH. Using the compensation circuit 302 shown in FIG. 6 results in a nominal 30 mOhm output impedance (FIG. 7-701) with little or no impedance phase shift (FIG. 7-702), for the DFR up to 20 kHz.

Example 3

Impedance Compensation with Lower Output Impedance

Figure 8:
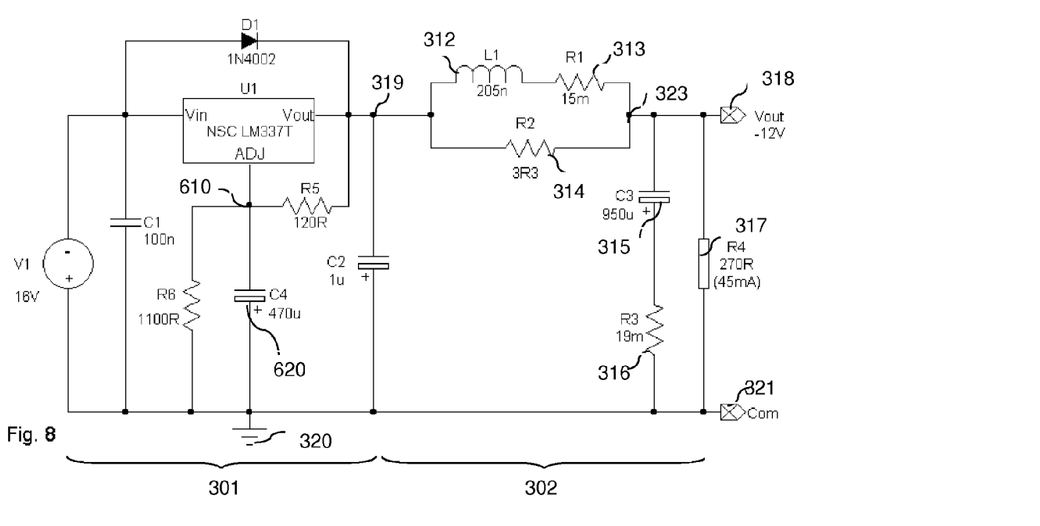
FIG. 8 is a schematic diagram of the compensation circuit topology applied to an adjustable-output regulator, the National Semiconductor LM337T, optimized for a nominal 20 mOhm output impedance, according to an embodiment.
Figure 9:
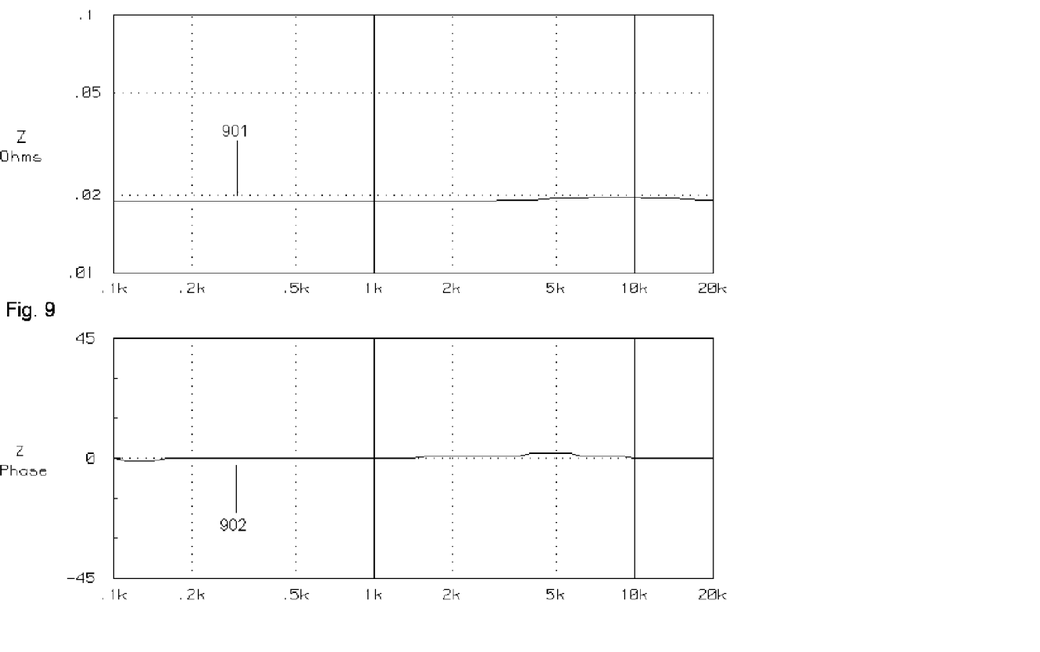
FIG. 9 depicts graphs of output impedance vs frequency and impedance phase vs frequency, for the circuit in FIG. 8.

Using the same regulator 301 as Example 2, this example shows how the compensation circuit values for a given regulator 301 can be re-optimized for a different output impedance. With the same load idle current of 45 mA, using the compensation circuit 302 shown in FIG. 8 results in a nominal 20 mOhm output impedance (FIG. 9-901) with little or no impedance phase shift (FIG. 9-902), for the DFR up to 20 kHz.

The successful use of the invention depends greatly on the ability of the user to accurately measure very small values of impedance, sometimes in the presence of a large DC voltage. Appropriate measuring equipment and low-impedance measurement techniques should be employed.

Some limitations exist in the use of the invention, revolving around two basic considerations. First, all of the reactances that are being balanced such as (FIG. 3; Lout 310+L1 312, and C3 315) are lossy within the DFR, that is, none of them are pure reactances but are transitioning from nominally reactive to nominally resistive within the DFR. Were they pure, then in theory, using the formula $R^2=L/C$ for conjugate impedances, one could find any number of combinations of L/C values that would create a substantially uniform output impedance for a given R value. In practice, that is not the case, and the range of L/C combinations that can be used with success at a given impedance value is limited. Second, the concept of complex conjugate impedance matching applies to matching a reactive source with a reactive load at a single frequency, not over a range of frequencies. This renders the conjugate impedance formula useful only as a first approximation with the invention.

In particular, the successful use of the invention is highly dependent upon the impedance characteristics of the output capacitance (FIGS. 3-302; C3 315 and R3 316). As can be seen in the examples, the compensation circuit 302 requires the use of relatively large values of capacitance. At the present state of the art, most embodiments of the invention will use an electrolytic capacitor ("electrolytics") as all or part of C3 315. Two characteristics of electrolytics will influence their successful use in the compensation circuit 302.

First, the capacitance of electrolytics decreases with increasing frequency, caused in part as the capacitor's ESR becomes larger relative to the capacitive reactance. For best results, the value of C3 315 should be chosen such that the resonant frequency of C3 315 with (Lout 310+L1 312) be toward the higher end (logarithmically) of the DFR value, one octave below the DFR being a reasonable starting point. The frequency used to measure the values of Lout 310, L1 312, and C3 315 should also be in that same vicinity; hence the choice of 10 kHz with a 20 kHz DFR in the examples and Detailed Description.

Second, like all capacitors, electrolytics have an Equivalent Series Inductance (ESL) component, a consequence of their construction, geometry, and lead length. The series interaction of a large output capacitance C3 315 with even a moderate ESL can upset the conjugate impedance balance at the upper end of the DFR. Therefore, the best results will be obtained with capacitor designs which minimize the ESL. These are sometimes called "high-frequency" or "low-impedance" types. In some cases it may be necessary to use two or more parallel capacitors to minimize the ESL while achieving the desired capacitance value.

A special circumstance exists in some embodiments of the invention. Refer again to FIG. 3. As defined previously, Lout 310+L1 312 combine to form the inductive reactance portion of the source impedance. Since Lout 310 is determined by the regulator 301 operating at a specific load idle current, once Lout 310 is established, L1 312 is the only variable inductance. In embodiments that require minimal values for L1 312, a discrete physical inductor will not be needed, and L1 312 will consist entirely of the inductance in the connecting traces or wires between the regulator output 319 and the capacitance C3 315. In those cases, R2 314 may become unnecessary in the circuit topology 302, because the inductance it is intended to bypass has been reduced to such a small value as to render bypassing it unnecessary.

While this embodiment is indeed desirable from the point of view of reduced parts count, removing L1 312 as a variable makes the compensation circuit 302 more difficult to optimize with success. The combination of a fixed value of source inductance, with the two previously described limitations imposed by the output capacitance, results in a compensation circuit 302 that can only be adapted to a narrow range of output impedances, and with very demanding requirements on the characteristics of capacitance C3 315. In most embodiments of the invention, the flexibility offered by the ability to optimize any or all of the variable components in the compensation circuit 302 topology will be invaluable to achieve the desired result.

While the examples show the invention applied to series voltage regulators 301, it can be applied to any voltage regulator 301 with an inductive output impedance characteristic.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

What is claimed is:

1. An impedance compensation circuit (ICC) for being configured at an output terminal (OT) of a DC voltage regulator circuit (RC), said ICC comprising:
  individual components that are workable in combination with an inherent output impedance characteristic of said RC,
  said individual components being optimizable for providing a substantially uniform AC output impedance characteristic and impedance phase over a first defined frequency range (DFR) and an operating idle current under a load, by creating a condition where a source impedance and a load impedance are complex conjugates, said source impedance being a series combination of said inherent output impedance characteristic of said RC and a first impedance due to a first portion of said individual components, while said load impedance is a parallel combination of a second impedance due to a second portion of said individual components and said load, when said ICC is configured with said RC and said load.

2. The ICC as claimed in claim 1, wherein said first DFR is substantially up to 20 kHz.

3. The ICC as claimed in claim 1 wherein said individual components are further optimizable for maintaining a desirably low value of said substantially uniform AC output impedance characteristic over a second DFR and a specified idle current, said specified idle current being higher than said operating idle current and obtainable by adding a static load in parallel with said load.

4. The ICC as claimed in claim 3, wherein said first DFR is same as said second DFR.

5. An impedance compensation circuit (ICC) for being configured at an output terminal (OT) of a DC voltage regulator circuit (RC), said ICC comprising:
   individual components, further comprising:
   a serial combination of an inductance (L1) and a resistance (R1), to form a first element;
   a parallel combination of a resistance (R2) and said first element to form a two terminal second element, said second element being connectable to said OT by a first terminal; and
   a serial combination of a capacitance (C3) and a resistance (R3), to form a third element that is connected between a second terminal of said second element and a common terminal, wherein an output (Vout) from said ICC can be provided between said second terminal and said common terminal for sourcing a load R4, wherein
   said L1 includes any inductance in connecting traces or wires between said OT and said C3, said L1 and an output inductance (Lout) of said RC combinedly forming an inductive element of a source impedance, said source impedance being a series combination of an inherent output impedance characteristic of said RC and a first impedance due to said second element, wherein
   said R1 includes a resistance of L1 and any resistance in connecting traces or wires between said OT and said C3, said R1 and an output resistance (Rout) of said RC combinedly forming a resistive element of said source impedance, said R1 coordinating with said R3 to establish said source impedance, wherein
   said R2 operatively sets an upper limit to an impedance rise of said L1 at high frequencies normally above a first defined frequency range (DFR) and said C3 forms a capacitive element of a load impedance, wherein said load impedance is a parallel combination of a second impedance due to said third element and said load R4, when said ICC is configured with said RC and said load R4, wherein
   said R3 is a serial combination of: a) an equivalent resistance of said C3, b) any resistance in connecting traces or wires between said C3 and said common terminal, and c) any added resistance necessary to achieve a desired value of said R3, wherein said R3 is substantially equal to (said R1+said Rout) and defines a resistive element of said load impedance, wherein
   said individual components are workable in combination with said inherent output impedance characteristic of said RC, wherein
   said individual components are optimized for providing a substantially uniform AC output impedance characteristic and impedance phase over said first DFR and an operating idle current under said load R4, by creating a condition where said source impedance and said load impedance are complex conjugates.

6. The ICC as claimed in claim 5 wherein said individual components are further optimizable for maintaining a desirably low value of said substantially uniform AC output impedance characteristic over a second DFR and a specified idle current, said specified idle current being higher than said operating idle current and obtainable by adding a static load R5 in parallel with said load R4.

7. The ICC as claimed in claim 6, wherein said first DFR and is same as said second DFR.

8. The ICC as claimed in claim 6, wherein, said L1 and said C3 are both measured within said first or second DFR as applicable.

9. The ICC as claimed in claim 6, wherein said static load is a series combination of a light-emitting diode (LED) and a current-limiting resistor.

10. The ICC as claimed in claim 6, wherein said R2 is determined by interaction with a reactance of said second load, substantially above said second DFR.

11. The ICC as claimed in claim 6, wherein when said R2 is less than said R1*100, a parallel resistance value of said R2 is included in said R1.

12. The ICC as claimed in claim 6, wherein said C3 is measured at a normal operating temperature for said ICC.

13. The ICC as claimed in claim 6, wherein said Lout, said L1, said C3 and a resonant frequency of said C3 with (said Lout+said L1) are all measured towards a logarithmic higher end of said first or second DFR, as applicable.

14. The ICC as claimed in claim 6, wherein said first DFR is substantially up to 20 kHz.

15. The ICC as claimed in claim 6, wherein said R2 is optimizable to a substantially negligible value, when said L1 is substantially low.

16. A method of compensating a DC voltage regulator circuit (RC), said method comprises:
   configuring an impedance compensation circuit (ICC) at an output terminal (OT) of said RC, wherein said ICC comprises individual components that are workable in combination with an inherent output impedance characteristic of said RC, said individual components being optimizable for providing a substantially uniform AC output impedance characteristic and impedance phase over a first defined frequency range (DFR) and an operating idle current under a load, by creating a condition where a source impedance and a load impedance are complex conjugates, said source impedance being a series combination of said inherent output impedance characteristic of said RC and a first impedance due to a first portion of said individual components, while said load impedance is a parallel combination of a second impedance due to a second portion of said individual components and said load, when said ICC is configured with said RC and said load;
   establishing said first DFR;
   measuring said operating idle current;
   measuring said inherent output impedance characteristic of said RC;
   calculating an inductance of said RC within said first DFR; and
   optimizing said individual components for providing said substantially uniform AC output impedance characteristic and impedance phase over said first DFR and said operating idle current, by creating said condition where said source impedance and said load impedance are complex conjugates.

17. The method as claimed in claim 16, wherein said first DFR is substantially up to 20 kHz.

18. The method as claimed in claim 16 further comprises:
   optimizing for maintaining a desirably low value of said substantially uniform AC output impedance characteristic over a second DFR and a specified idle current, said specified idle current being higher than said operating idle current and obtainable by adding a static load in parallel with said load.

19. The method as claimed in claim 18, wherein said first DFR is same as said second DFR.

20. The method as claimed in claim 18, wherein said static load is a series combination of a light-emitting diode (LED) and a current-limiting resistor.

* * * * *